US011802895B2

(12) United States Patent
Sun et al.

(10) Patent No.: US 11,802,895 B2
(45) Date of Patent: Oct. 31, 2023

(54) AIRCRAFT GRID PHASE ANGLE TRACKER BASED ON NONLINEAR ACTIVE DISTURBANCE REJECTION

(71) Applicant: DALIAN UNIVERSITY OF TECHNOLOGY, Liaoning (CN)

(72) Inventors: Ximing Sun, Liaoning (CN); Ping Lin, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 177 days.

(21) Appl. No.: 17/625,307

(22) PCT Filed: Feb. 22, 2021

(86) PCT No.: PCT/CN2021/077161
§ 371 (c)(1),
(2) Date: Jan. 6, 2022

(87) PCT Pub. No.: WO2022/165861
PCT Pub. Date: Aug. 11, 2022

(65) Prior Publication Data
US 2023/0003778 A1 Jan. 5, 2023

(30) Foreign Application Priority Data
Feb. 3, 2021 (CN) .......................... 202110149481.2

(51) Int. Cl.
*G01R 25/00* (2006.01)
(52) U.S. Cl.
CPC .................................. *G01R 25/005* (2013.01)
(58) Field of Classification Search
CPC .... G01R 25/00; G01R 25/005; G01R 31/008; G01R 29/16
See application file for complete search history.

(56) References Cited

U.S. PATENT DOCUMENTS 10,985,668 B2 * 4/2021 Banceanu ........... H02M 7/4835
11,342,862 B2 * 5/2022 Al-Areqi ................... H02J 3/36
(Continued)

FOREIGN PATENT DOCUMENTS

| CN | 107831365 A | 3/2018 |
|---|---|---|
| CN | 108599261 A | 9/2018 |
| CN | 109473983 A | 3/2019 |

OTHER PUBLICATIONS

Office Action and Search Report corresponding to Chinese application No. 202110149481.2 dated Sep. 30, 2021 (with English translation), pp. 14.
(Continued)

*Primary Examiner* — Sibin Chen
(74) *Attorney, Agent, or Firm* — Muncy, Geissler, Olds & Lowe (57) ABSTRACT

The present invention belongs to the technical field of aviation electrics and electric power, and provides an aircraft grid phase angle tracker based on nonlinear active disturbance rejection, which is used to estimate the grid phase angle on AC side of an aircraft grid. A embedded generator in the aircraft grid is arranged inside a compressor of an aviation gas turbine engine, and the embedded generator is directly coupled with the aviation gas turbine engine so that the AC frequency of the embedded generator varies with the speed of the aviation gas turbine engine. The present invention applies the nonlinear active disturbance rejection technology to the phase angle tracking of the more electric aircraft grid, is simple in operation and high in accuracy, and can realize high-accuracy tracking of the grid phase angle. The method has certain extensibility and can be extended to other fields.

1 Claim, 6 Drawing Sheets

(56) References Cited

U.S. PATENT DOCUMENTS

| | | |
|---|---|---|
| 2008/0011091 A1 | 1/2008 | Weldon |
| 2019/0199213 A1* | 6/2019 | Jaldanki .............. H02M 1/0022 |
| 2019/0288611 A1* | 9/2019 | Li ........................ H02M 1/126 |

OTHER PUBLICATIONS

Notification of Grant corresponding to Chinese application No. 202110149481.2 dated Nov. 23, 2021 (with English translation), pp. 5.

* cited by examiner

AIRCRAFT GRID PHASE ANGLE TRACKER BASED ON NONLINEAR ACTIVE DISTURBANCE REJECTION

TECHNICAL FIELD

The present invention belongs to the technical field of aviation electrics and electric power, and particularly relates to an aircraft grid phase angle tracker.

BACKGROUND

With the continuous improvement of aircraft electrical level, the more electric aircraft has emerged. The more electric aircraft can reduce the consumption rate of aviation kerosene, increase the working efficiency of aero-engine, and reduce the emissions of nitrogen oxide. The grid is an important part of the more electric aircraft. On the one hand, the aircraft grid provides power for the flight control system and the environmental control system, and furthermore, the aircraft grid provides power for the aircraft starter/generator machine. Its performance directly affects the working state of the aircraft system, and even affects the safety and reliability of the aircraft. The tracking of the grid phase angle is one of the important tasks of the aircraft grid system. Once the tracking of the grid phase angle is inaccurate, the working safety of the aircraft grid is affected, and the quality of the grid is decreased, which will damage the aircraft electrical device at a light level and affect the flight safety of the aircraft at a serious level. Therefore, it is very valuable to accurately track the angle of the aircraft grid, especially in the case of harmonic interference in the grid, which can improve the stability margin of the aircraft grid.

In the aspect of the aircraft grid phase angle tracker, the published literature in China and abroad records that the grid phase angle tracker is designed based on the proportional integral method or proportional integral differential method. Especially in the case of fast varying sinusoidal harmonic disturbances in the grid, the existing methods cannot well attenuate the harmonic disturbances to the angle of the aircraft grid. At the same time, most of the current grid phase angle trackers are based on single grid working frequency. The frequency of the grid of the more electric aircraft varies within the range of 360-800 Hz. The change of the grid frequency also affects the tracking accuracy of the grid phase angle tracker. The existing methods cannot satisfy the requirements of high-accuracy tracking of the aircraft grid phase angle.

For the aircraft grid phase angle tracker, the current design method has gradually failed to satisfy the actual needs of engineering. Therefore, it is an urgent problem to be solved to explore a design method of a high-accuracy grid phase angle tracker which is effective and suitable for engineering practice. Therefore, the high-accuracy tracking of the aircraft grid phase angle has broad research and application prospects.

SUMMARY

To solve the problems of complicated operation, low efficiency and low accuracy of tracking of grid phase angle in the prior art, the present invention proposes a high-accuracy tracking method for a nonlinear grid phase angle.

An aircraft grid phase angle tracker based on nonlinear active disturbance rejection comprises the following steps:

first step, modeling of the aircraft grid;
second step, design of the grid phase angle tracker according to the aircraft grid model;
third step, error analysis of grid phase angle tracking.
Concrete explanation is as follows:
first step, modeling of the aircraft grid;
step 1: defining a coordinate system firstly in order to facilitate analysis;
step 2: obtaining a nominal grid model of a more electric aircraft according to general nominal grid parameters of the more electric aircraft;
step 3: on the basis of step 1, obtaining a nonstandard grid model of the more electric aircraft by considering the cases of voltage amplitude imbalance in the grid, high harmonics in the grid and DC bias;
second step, design of the grid phase angle tracker according to the aircraft grid model;
step 4: considering the condition of voltage amplitude imbalance of the grid, obtaining a mathematical expression between the voltage amplitude imbalance of the grid and a grid phase angle;
step 5: considering high harmonics in the grid and obtaining a mathematical expression between the high harmonics in the grid and the grid phase angle;
step 6: considering the DC bias in the grid and obtaining a mathematical expression between the DC bias in the grid and the grid phase angle;
step 7: in order to collate the model information derived in step 4, step 5 and step 6, obtaining a nominal model required by the design of a nonlinear active disturbance rejection controller;
step 8: designing the grid phase angle tracker based on nonlinear active disturbance rejection based on step 7;
third step, error analysis of grid phase angle tracking;
step 9: in MATLAB/Simulink environment, establishing an aircraft grid model and designing the aircraft grid phase tracker based on nonlinear active disturbance rejection by a modular modeling technology; verifying the performance of the aircraft grid phase angle tracker based on nonlinear active disturbance rejection; and comparing the estimation error of the aircraft grid phase angle tracker based on nonlinear active disturbance rejection with the estimation error of the aircraft grid phase angle tracker based on linear active disturbance rejection; for the fast varying disturbance of the grid, the accuracy of the aircraft grid phase angle tracker based on nonlinear active disturbance rejection is higher, and the convergence rate of the tracking error of the grid phase angle is faster, which indicates that the method proposed by the present invention can accurately estimate the grid phase angle.

The present invention has the following beneficial effects:
The existing aircraft grid phase angle tracker is difficult to achieve high-precision tracking of the grid phase angle. In engineering practice, at present, the grid phase angle tracker is generally designed by the methods based on proportional integral method, proportional integral differential method or linear active disturbance rejection method. The existing literature indicates that the tracking accuracy of the grid phase angle tracker based on linear active disturbance rejection is higher than that of the grid phase angle tracker based on proportional integral and proportional integral differential. The present invention provides a high-accuracy nonlinear grid phase angle tracking method based on model information, and makes up for the deficiencies of the existing grid phase tracker technology based on linear active disturbance rejection. The present invention applies the nonlinear active disturbance rejection technology to the phase angle tracking of the more electric aircraft grid, is simple in operation and high in accuracy, and can realize high-accuracy tracking of the grid phase angle. The method has certain extensibility and can be extended to other fields.

DETAILED DESCRIPTION

To make the purpose, technologies and the advantages of the present invention more clear, the present invention will be further described below in detail in combination with the drawings and the embodiments.

Figure 1:
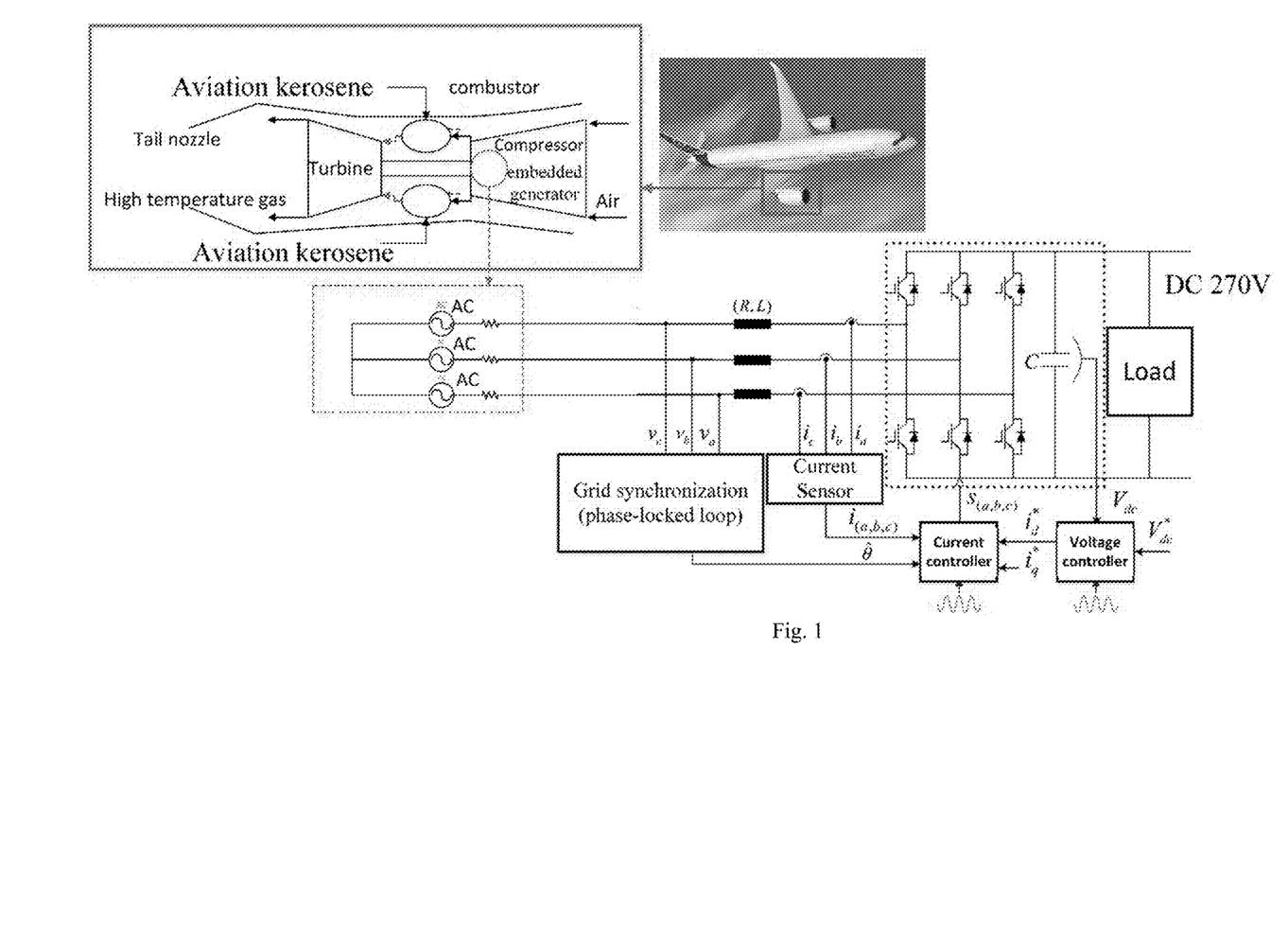
FIG. 1 is a local structural block diagram of an aircraft grid.
Figure 2:
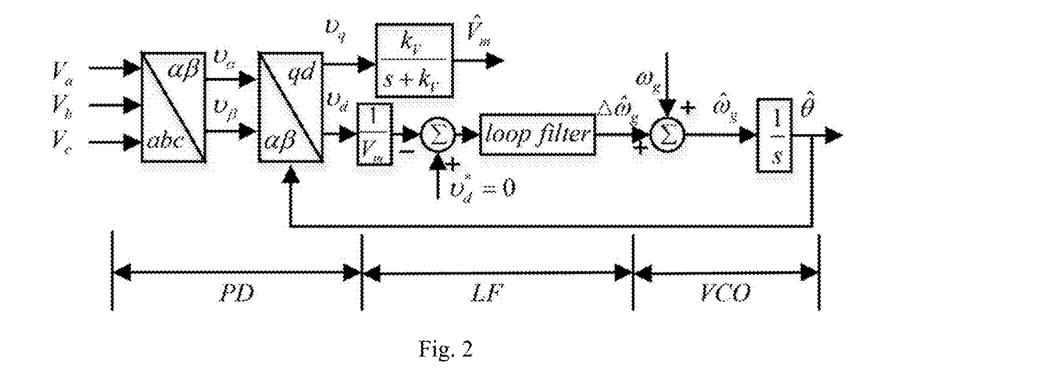
FIG. 2 is a whole block diagram of an aircraft grid phase angle tracker.

An aircraft grid phase angle tracker based on nonlinear active disturbance rejection framework, also known as a grid synchronization (phase-locked loop) module, i.e., the grid synchronization (phase-locked loop) module in FIG. 1, is used to estimate the grid phase angle on AC side of an aircraft grid; a embedded generator in the aircraft grid is arranged inside a compressor of an aviation gas turbine engine, and the embedded generator is directly coupled with the aviation gas turbine engine so that the AC frequency of the embedded generator varies with the speed of the aviation gas turbine engine; three-phase AC generated by an AC generator can be specifically describe as $$V_a = V_m \cos(\omega t), V_b = V_m \cos\left(\omega t - \frac{2}{3}\pi\right) \text{ and } V_c = V_m \cos\left(\omega t + \frac{2}{3}\pi\right),$$

wherein $V_m$ is the amplitude of the three-phase AC; $V_a$, $V_b$ and $V_c$ indicate three-phase AC respectively; $\omega$ is the frequency of the three-phase AC; and $\theta = \omega t$ is the grid phase angle. The core job of the patent is to design an aircraft grid phase angle tracker based on nonlinear active disturbance rejection to estimate the grid phase angle under complex conditions of amplitude change and frequency change of the three-phase AC, voltage amplitude imbalance in the grid, high harmonics in the grid and DC bias, comprising the following steps:

Step 1: to facilitate analysis, firstly, defining a coordinate system for the purpose of converting AC $V_{abc}$ in a three-phase stationary rotating coordinate system to a two-phase stationary coordinate system $v_{\alpha\beta}$, and finally to a two-phase rotating coordinate system $v_{qd}$; the ultimate purpose of converting to the two-phase rotating coordinate system is to control $v_d=0$ to lay a foundation for estimating the grid phase angle indirectly, and conversion relationships between the coordinate systems are described with formula (1):

$$\begin{cases} v_{\alpha\beta} = T_s \cdot V_{abc} \\ v_{qd} = T_e(\hat{\theta}) \cdot v_{\alpha\beta} \end{cases} \quad (1)$$

wherein $$V_{abc} = [V_a \ V_b \ V_c]^T, v_{\alpha\beta} = [v_\alpha \ v_\beta]^T, v_{qd} = [v_q \ v_d]^T,$$

$$T_s = \frac{2}{3}\begin{bmatrix} 1 & -\frac{1}{2} & -\frac{1}{2} \\ 0 & -\frac{\sqrt{3}}{2} & \frac{\sqrt{3}}{2} \end{bmatrix}, T_e(\hat{\theta}) = \begin{bmatrix} \cos(\hat{\theta}) & -\sin(\hat{\theta}) \\ \sin(\hat{\theta}) & \cos(\hat{\theta}) \end{bmatrix}$$

$\hat{\theta}$ is an estimated value of the grid phase angle.

Step 2: using the embedded generator as an AC voltage source, and obtaining a model of a nominal AC voltage source of a more electric aircraft according to general nominal grid parameters of the more electric aircraft, with a mathematical expression satisfying formula (2):

$$\begin{bmatrix} V_a \\ V_b \\ V_c \end{bmatrix} = V_m \begin{bmatrix} \cos(\theta) \\ \cos\left(\theta - \frac{2}{3}\pi\right) \\ \cos\left(\theta + \frac{2}{3}\pi\right) \end{bmatrix} \quad (2)$$

wherein $V_a$, $V_b$, and $V_c$ are voltage of three-phase AC of the aircraft respectively; $\theta=\omega t$ is the grid phase angle; $\omega$ is three-phase AC frequency; and $V_m$ is a three-phase voltage amplitude. AC $V_{abc}$ under the three-phase stationary rotating coordinate system in the formula (2) is converted to the two-phase rotating coordinate system $v_{qd}$, and $v_d=0$ is controlled to ensure that the estimated value of the grid phase angle ultimately converges to a true value of the grid phase angle.

Step 3: in the case of voltage amplitude imbalance in the grid, high harmonics in the grid and DC bias, the AC in the grid of the more electric aircraft does not satisfy the situation shown in formula (2). The cases of voltage amplitude imbalance in the grid, high harmonics in the grid and DC bias respectively correspond to mathematical expressions which satisfy formula (3), formula (4) and formula (5);

$$\begin{bmatrix} V_a \\ V_b \\ V_c \end{bmatrix} = V_m \begin{bmatrix} \cos(\theta) \\ (1+\beta)\cos\left(\theta - \frac{2}{3}\pi\right) \\ (1+\gamma)\cos\left(\theta + \frac{2}{3}\pi\right) \end{bmatrix} \quad (3)$$

-continued $$\begin{bmatrix} V_a \\ V_b \\ V_c \end{bmatrix} = \qquad (4)$$

$$\begin{bmatrix} V_m\cos(\theta) + v_5\cos(5\theta) + \ldots + v_{2n-1}\cos((2n-1)\theta) \\ V_m\cos\left(\theta - \frac{2}{3}\pi\right) + v_5\cos\left(5\left(\theta - \frac{2}{3}\pi\right)\right) + \ldots + v_{2n-1}\cos((2n-1)\left(\theta - \frac{2}{3}\pi\right)) \\ V_m\cos\left(\theta + \frac{2}{3}\pi\right) + v_5\cos\left(5\left(\theta + \frac{2}{3}\pi\right)\right) + \ldots + v_{2n-1}\cos((2n-1)\left(\theta + \frac{2}{3}\pi\right)) \end{bmatrix}$$

$$\begin{bmatrix} V_a \\ V_b \\ V_c \end{bmatrix} = V_m \begin{bmatrix} \cos(\theta) + V_{ao} \\ \cos\left(\theta - \frac{2}{3}\pi\right) + V_{bo} \\ \cos\left(\theta + \frac{2}{3}\pi\right) + V_{co} \end{bmatrix} \qquad (5)$$

wherein β and γ are respectively the voltage amplitude imbalance coefficients of the aircraft three-phase grid. $v_5$ is the amplitude of 5th voltage harmonic components of the aircraft three-phase grid, and $v_{2n-1}$ is the amplitude of 2n−1th voltage harmonic components of the aircraft three-phase grid; $V_{ao}$, $V_{bo}$ and $V_{co}$ are the voltage DC biases of the aircraft three-phase grid respectively.

Second step, design of the grid phase angle tracker;

Step 4: considering the condition of voltage amplitude imbalance of the grid, when $v_d$=0, obtaining a static error between the estimated value of the grid phase angle and the true value of the grid phase angle through mathematical derivation, as shown in formula (6);

$$\begin{cases} \theta - \hat{\theta} = E_{pu}\cos(2\theta + \phi_{pu}) \\ E_{pu} = \sqrt{\left(\frac{\beta-\gamma}{2\sqrt{3}}\right)^2 + \left(\frac{\beta-\gamma}{6}\right)^2} \\ \phi_{pu} = -\tan^{-1}\left(\frac{1}{\sqrt{3}}\frac{\beta+\gamma}{\beta-\gamma}\right) \end{cases} \qquad (6)$$

wherein $\hat{\theta}$ is the estimated value of the aircraft grid phase angle; $E_{pu}$ is an amplitude gain coefficient caused by the voltage imbalance; and $\phi_{pu}$ is an initial phase angle caused by the voltage imbalance.

Step 5: considering the situation of high harmonics in the grid, when $v_d$=0, obtaining a static error between the estimated value of the grid phase angle and the true value of the grid phase angle through mathematical derivation, as shown in formula (7);

$$\begin{cases} \theta - \hat{\theta} = E_{6h}\sin 6\theta + E_{12h}\sin 6\theta + \ldots + E_{6nh}\sin 6n\theta \\ E_{6h} = \frac{V_5 - V_7}{V_m} \\ E_{12h} = \frac{V_{11} - V_{13}}{V_m} \\ E_{6nh} = \frac{V_{6n-1} - V_{6n+1}}{V_m} \end{cases} \qquad (7)$$

wherein $v_5$ is the amplitude of 5th voltage harmonics, $v_7$ is the amplitude of 7th voltage harmonics, $v_{11}$ is the amplitude of 11th voltage harmonics, $v_{13}$ is the amplitude of 13th voltage harmonics, is the amplitude of 6n−1th voltage harmonics, $V_{6n+1}$ is the amplitude of 6n+1th voltage harmonics, $E_{6h}$ is the voltage amplitude synthesized by the amplitudes of 5th and 7th harmonic components, $E_{12h}$ is the voltage amplitude synthesized by the amplitudes of 11th and 13th harmonic components, $E_{6h}$, is the voltage amplitude synthesized by the amplitudes of 6n−1th and 6n+1th harmonic components, and n is a positive integer;

Step 6: considering the situation of DC bias in the grid, when $v_d$=0, obtaining a static error between the estimated value of the grid phase angle and the true value of the grid phase angle through mathematical derivation, as shown in formula (8);

$$\begin{cases} \theta - \hat{\theta} = E_{do}\cos(\theta + \phi_{do}) \\ E_{do} = \sqrt{\frac{4}{9}(V_{ao} + V_{bo} + V_{co})^2 + \frac{1}{3}(-V_{bo} + V_{co})^2} \\ \phi_{do} = -\tan^{-1}\left(\frac{2}{3\sqrt{3}}\frac{V_{ao} + V_{bo} + V_{co}}{-V_{bo} + V_{co}}\right) \end{cases} \qquad (8)$$

wherein $V_{ao}$, $V_{bo}$ and $V_{co}$ are the voltage DC biases of the aircraft three-phase grid respectively, $E_{do}$ is an amplitude gain coefficient caused by the DC bias of the grid, and $\phi_{do}$ is an initial phase angle caused by the DC bias of the grid.

Step 7: brief introduction of step 4, step 5 and step 6 indicates that the grid has static errors in the estimation of the grid phase angle caused by voltage amplitude imbalance, high harmonics in the grid and DC bias; in order to eliminate the static errors, integrating the information of voltage amplitude imbalance, high harmonics in the grid and DC bias in the grid into the grid synchronization (phase-locked loop) module shown in FIG. 1; the traditional proportional integral grid phase angle tracker/the proportional integral differential grid phase angle tracker cannot integrate the model information into the grid synchronization (phase-locked loop) module and has poor anti-interference capability; thus, a grid phase angle tracker based on nonlinear active disturbance rejection of model information needs to be designed. Before the grid phase tracker is designed, according to the principle of linear superposition, the information of step 4, step 5 and step 6 is superimposed into formula (9) to obtain a nominal mathematical model required by the grid phase angle tracker based on nonlinear active disturbance rejection, as shown in formula (9);

$$\begin{cases} x_1^{\&} = b_0 u + x_2, \\ x_2^{\&} = -q \end{cases} \qquad (9)$$

wherein $$x_1 = \frac{v_d}{V_m}, \; x_2 = (b - b_0)(\hat{\omega} - \omega) + \frac{d_{total}}{V_m}, \; u = \hat{\omega} - \omega.$$

$$d_{total} = d_{PU}^{\&} + d_{VO}^{\&} + d_{VH}^{\&} + d_{LIN}^{\&}$$

$$d_{PU} = V_m\left[\frac{\beta-\gamma}{2\sqrt{3}}\cos(2\theta) - \frac{\beta+\gamma}{6}\sin(2\theta)\right],$$

$$d_{VO} = E_{do}\cos(\theta + \phi_{do}),$$

$$d_{VH} = V_m E_{6h}\sin 6\theta + V_m E_{12h}\sin 6\theta + \ldots + v_m E_{6nh}\sin 6n\theta,$$

$$d_{LIN} = -\left(\frac{\beta+\gamma}{3} + 1\right)V_m\sin(\theta - \hat{\theta}) + \left(\frac{\beta+\gamma}{3} + 1\right)V_m(\theta - \hat{\theta}).$$

b is the gain coefficient of control input, u is the control input, $b_0$ is the estimated value of the gain coefficient of the control input, ω is grid frequency, $\hat{\omega}$ is the estimated value of the grid frequency, $d_{total}$ is total disturbance, $d_{PU}$ is disturbance caused by voltage imbalance, $d_{VO}$ is disturbance caused by voltage DC bias, $d_{VH}$ is disturbance caused by voltage high harmonics, and $d_{LIN}$ is disturbance caused by linearization.

Figure 3:
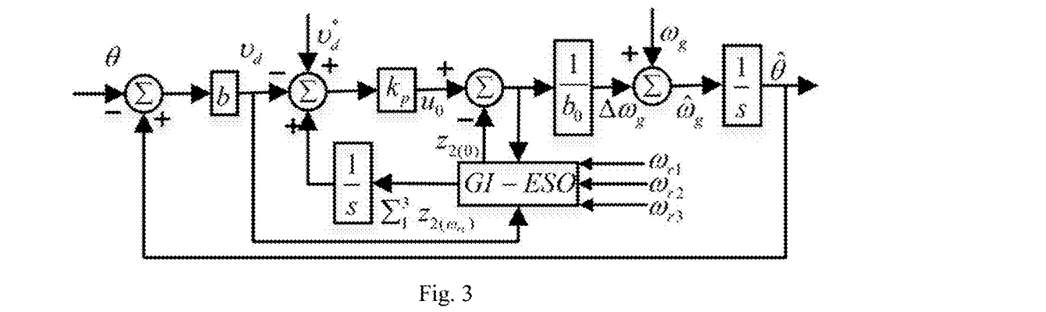
FIG. 3 is a schematic diagram of an aircraft grid phase angle tracker based on nonlinear active disturbance rejection.
Figure 4:
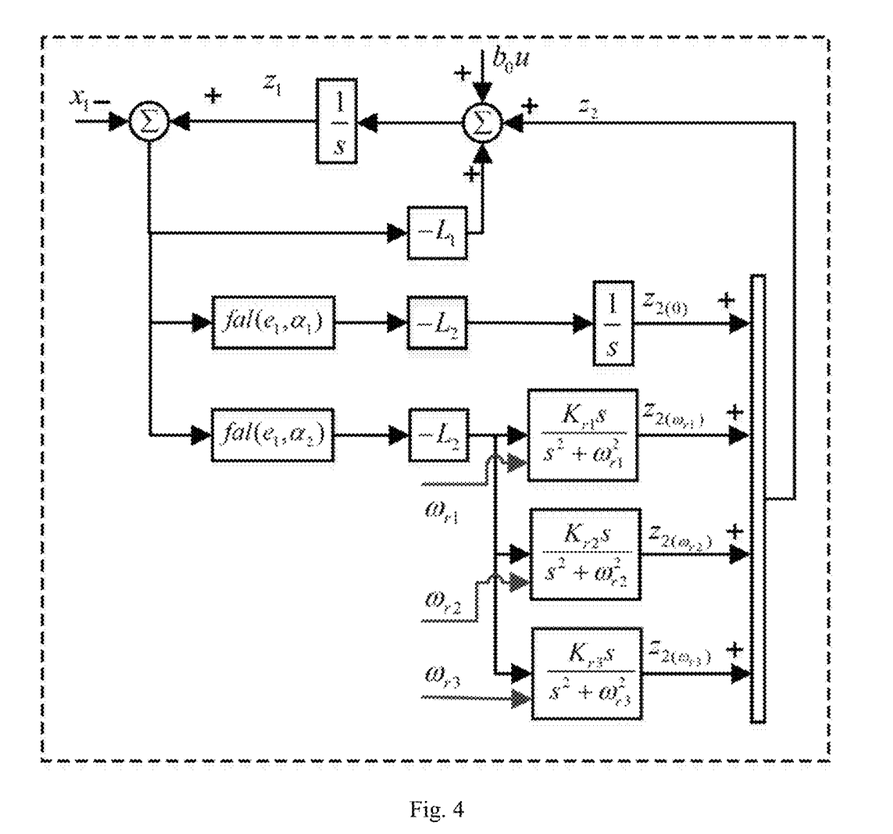
FIG. 4 is a schematic diagram of a generalized integral nonlinear extended state observer (GI-ESO) of nonlinear active disturbance rejection.
Figure 5A:
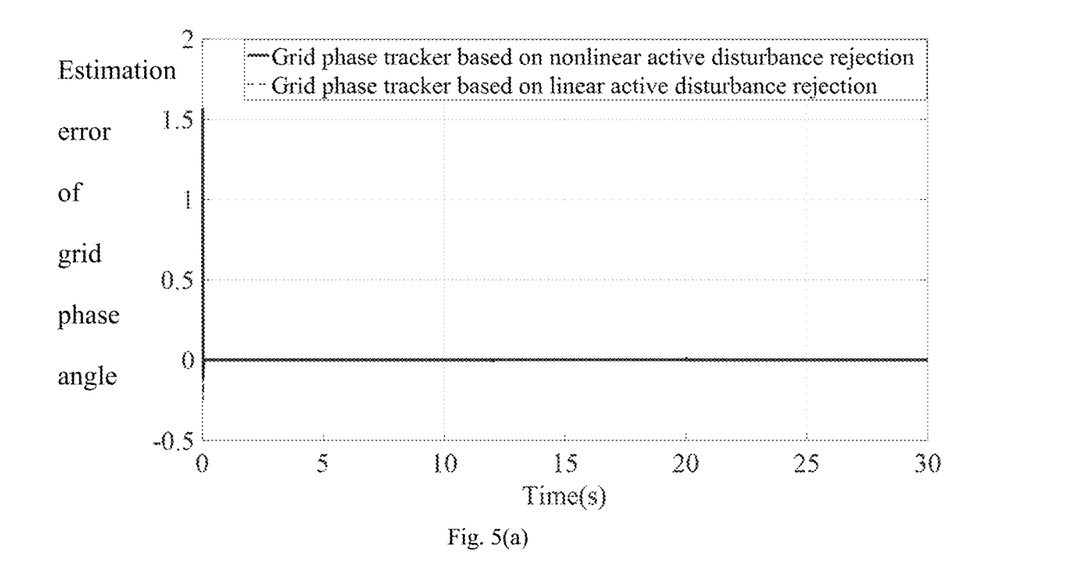
FIG. 5(a) is a whole schematic diagram of comparison of grid phase angle errors between two grid phase trackers.
Figure 5B:
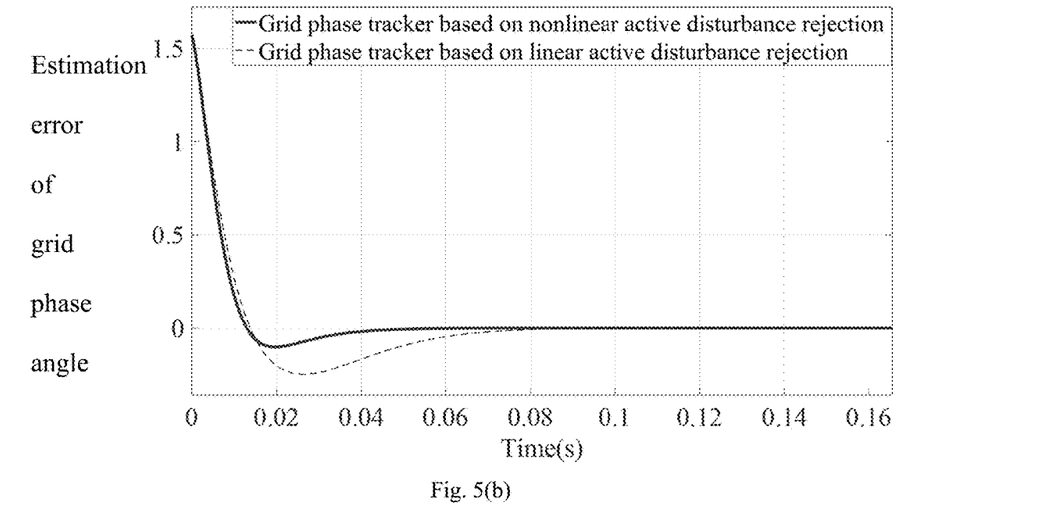
FIG. 5(b) is a local schematic diagram of comparison of grid phase angle errors between two grid phase trackers.
Figure 5C:
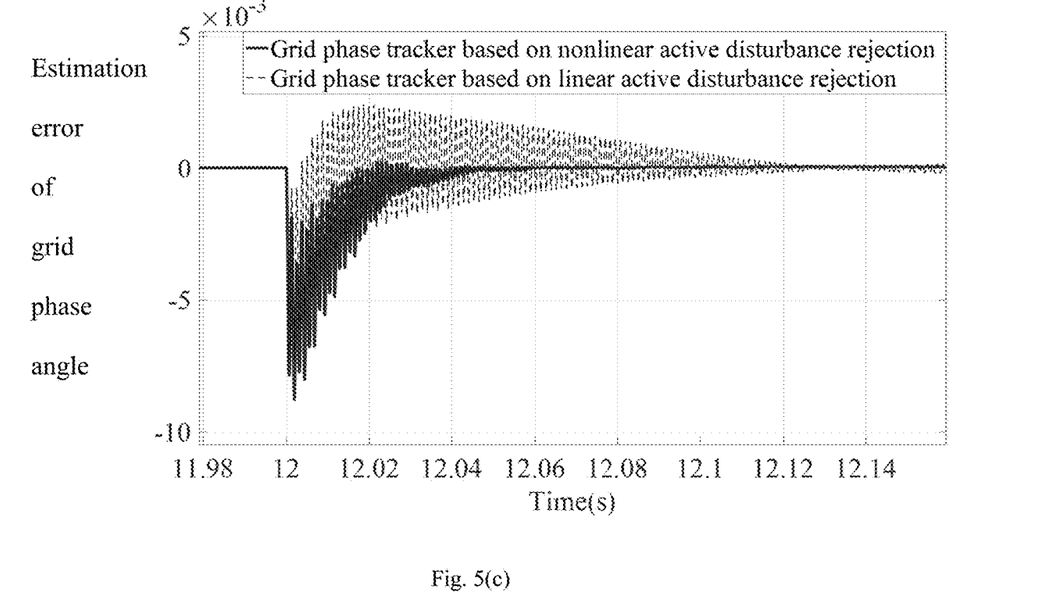
FIG. 5(c) is a local schematic diagram of comparison of grid phase angle errors between two grid phase trackers.
Figure 5D:
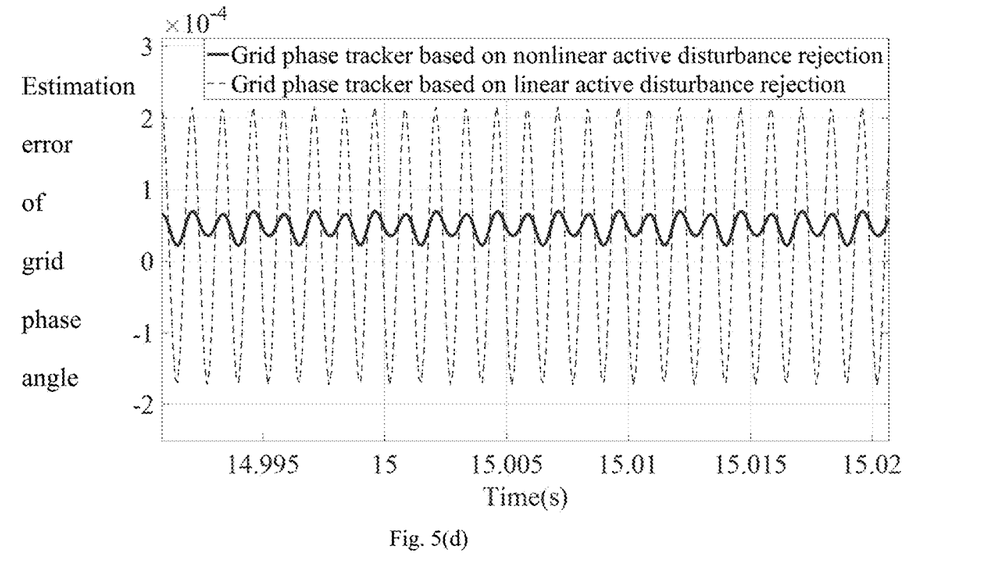
FIG. 5(d) is a local schematic diagram of comparison of grid phase angle errors between two grid phase trackers.
Figure 5E:
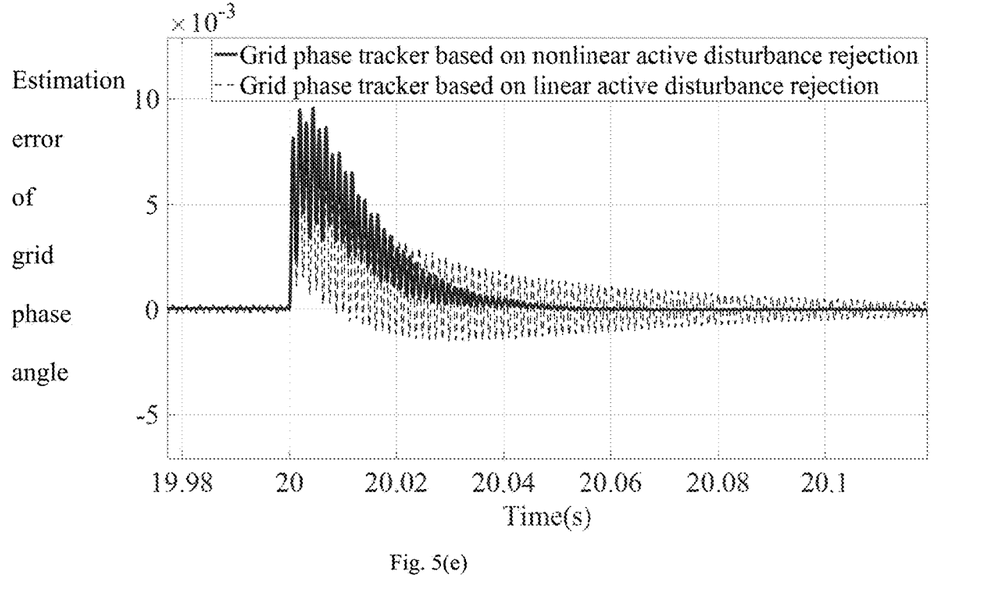
FIG. 5(e) is a local schematic diagram of comparison of grid phase angle errors between two grid phase trackers.

Step 8: designing the grid phase angle tracker based on nonlinear active disturbance rejection based on formula (9), as shown in FIG. 3, which is composed of formula (10) and formula (11); formula (10) is a linear state error feedback law, and formula (11) is a generalized integral nonlinear extended state observer (GI-ESO); formula (11) corresponds to FIG. 4; u calculated in formula (10) is a difference value between the estimated grid frequency and the real grid frequency; the real grid frequency ω is equal to the sum of U and the speed of the aviation gas turbine engine; since the speed of the aviation gas turbine engine can be measured by sensors, the information is known; special attention is paid to that the unit of the speed of the aviation gas turbine engine here should exist in the form of rad/s; and finally, integral calculation is conducted on ω to obtain the phase angle of the aircraft grid. Special note: the nonlinear switching function $fal(e_1, \alpha_i)$ is introduced to perform nonlinear transformation on the observation error $e_1$. Compared with the generalized integral linear extended state observer, nonlinear functions are introduced so that the observation efficiency of the generalized integral nonlinear extended state observer can be increased;

$$\begin{cases} e_2 = v_d^* - v_d \\ u = \dfrac{u_0 + k_p \int \sum_{i=1}^{3} z_{2(\omega_{ri})} dt - z_{2(0)}}{b_0} \\ u_0 = k_p \cdot e_2 \end{cases} \quad (10)$$

$$\begin{cases} e_1 = z_1 - x_1 \\ \dot{z}_1 = z_2 - L_1 \cdot e_1 + b_0 u \\ \dot{z}_2 = -L_2 \cdot fal(e_1, \alpha_1) + g_1 + g_2 + g_3 \\ \dot{d}_1 = g_1 \\ \dot{d}_2 = g_2 \\ \dot{d}_3 = g_3 \\ \dot{g}_1 = -\omega_{r1}^2 d_1 + \dot{u}_1 K_{r1} \\ \dot{g}_2 = -\omega_{r2}^2 d_2 + \dot{u}_1 K_{r2} \\ \dot{g}_3 = -\omega_{r3}^2 d_3 + \dot{u}_1 K_{r3} \\ u_1 = -L_2 \cdot fal(e_1, \alpha_2) \end{cases} \quad (11)$$

wherein $fal(e_1, \alpha_i) = |e_1|^{\alpha_i} \text{sign}(e_1)$, $i \in \{1, 2, 3, 4, 5\}$.

Wherein $v_d^*$ is the reference value of $v_d$, $k_p$ is a proportionality coefficient, $z_1$ is the estimated value of $x_1$, $z_2$ is the estimated value of $x_2$, and $L_1$ and $L_2$ are the gain coefficients of the generalized integral nonlinear extended state observer; $z_{2(\omega_{r1})} = \int g_1 dt$; $z_{2(\omega_{r2})} = \int g_2 dt$, $z_{2(\omega_{r3})} = \int g_3 dt$ and $z_{2(0)}$ are unmodeled dynamic estimated values; $z_{2(\omega_{r1})} = d_1$; $z_{2(\omega_{r2})} = d_2$; $z_{2(\omega_{r3})} = d_3$; $\dot{d}_1$ is the derivative of the time of $d_1$; $\dot{d}_2$ is the derivative of the time of $d_2$; $\dot{D}_3$ is the derivative of the time of $d_3$; $\omega_{r1} = \omega$ is frequency compensation in the case of DC bias in grid voltage; $K_{r1}$ is the gain coefficient of the frequency compensation; $\omega_{r2} = 2\omega$ is frequency compensation in the case of grid voltage imbalance; $K_{r2}$ is the gain coefficient of the frequency compensation; $\omega_{r3} = 6\omega$ is frequency compensation in the case of the high harmonics in the grid voltage; $K_{r3}$ is the gain coefficient of the frequency compensation; $\dot{u}_1$ is the derivative of time of $u_1$; and $\alpha_1$ and $\alpha_2$ are real numbers between 0 and 1.

Figure 6:
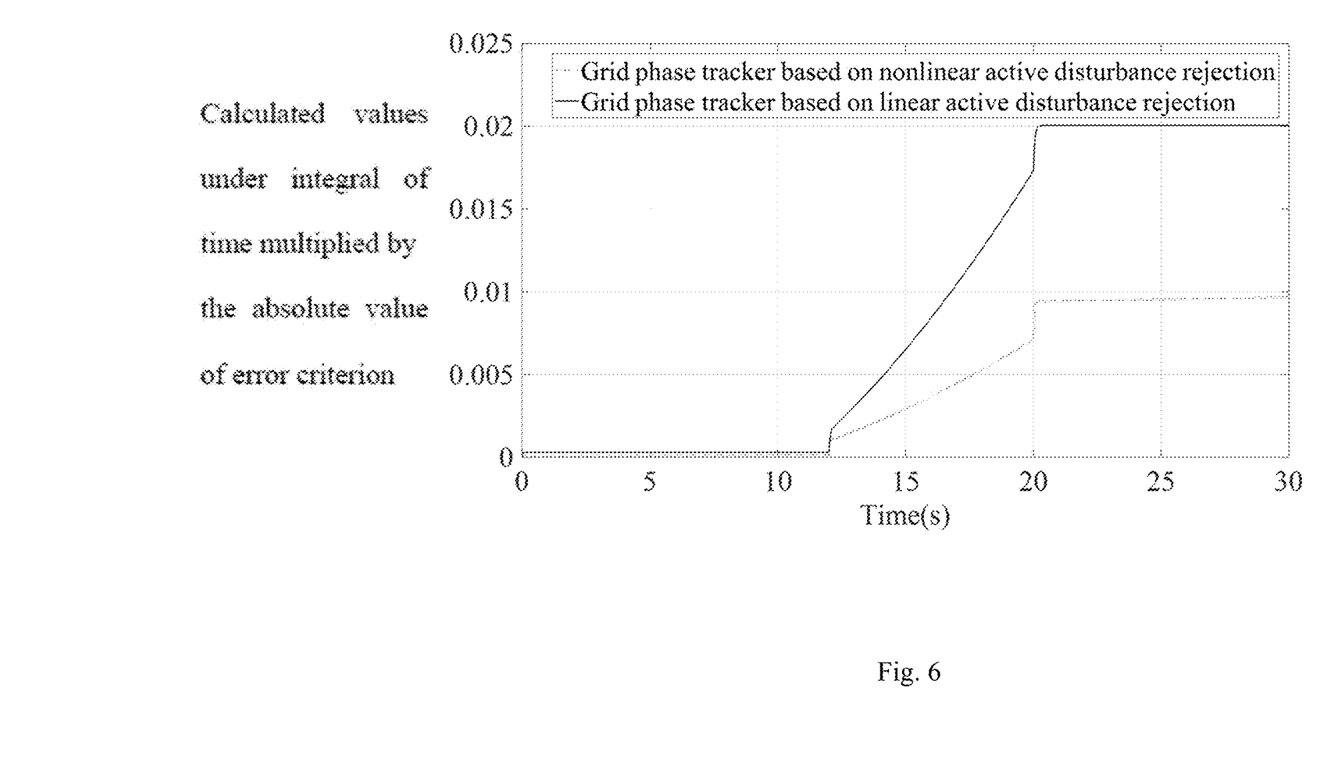
FIG. 6 is a comparison diagram of calculated values of grid phase angle errors under integral of time multiplied by the absolute value of error criterion.

Step 9: in MATLAB/Simulink environment, building an aircraft grid model and building the aircraft grid phase tracker based on nonlinear active disturbance rejection by a modular modeling technology; verifying the performance of the aircraft grid phase angle tracker based on nonlinear active disturbance rejection; and comparing the estimation error of the aircraft grid phase angle tracker based on nonlinear active disturbance rejection with the estimation error of the aircraft grid phase angle tracker based on linear active disturbance rejection; for the fast varying sinusoidal disturbance of the grid, the accuracy of the aircraft grid phase angle tracker based on nonlinear active disturbance rejection is higher, the convergence rate of the tracking error of the grid phase angle is higher, and the attenuation capacity for sinusoidal disturbance is strong, as shown in FIG. 5 and FIG. 6. If the calculated value under the integral of time multiplied by the absolute value of error criterion in FIG. 6 is smaller, the performance of the grid phase angle tracker is better, which indicates that the method proposed by the present invention can accurately estimate the grid phase angle.

The invention claimed is:

1. An aircraft grid phase angle tracker based on nonlinear active disturbance rejection, which is a grid synchronization module used to estimate the grid phase angle on AC side of an aircraft grid; a embedded generator in the aircraft grid is arranged inside a compressor of an aviation gas turbine engine, and the embedded generator is directly coupled with the aviation gas turbine engine so that the AC frequency of the embedded generator varies with the speed of the aviation gas turbine engine; therefore, a method for estimating a grid phase angle by the aircraft grid phase angle tracker based on nonlinear active disturbance rejection is designed, comprising the following steps:

step 1: firstly, defining a coordinate system, and converting AC $V_{abc}$ in a three-phase stationary rotating coordinate system to a two-phase stationary coordinate system $v_{\alpha\beta}$ and finally to a two-phase rotating coordinate system $v_{qd}$; and then controlling $v_d = 0$ to estimate the grid phase angle, and describing conversion relationships between the coordinate systems with formula (1):

$$\begin{cases} v_{\alpha\beta} = T_s \cdot V_{abc} \\ v_{qd} = T_e(\hat{\theta}) \cdot v_{\alpha\beta} \end{cases} \quad (1)$$

wherein $V_{abc} = [V_a \ V_b \ V_c]^T$, $v_{\alpha\beta} = [v_\alpha \ v_\beta]^T$, $v_{qd} = [v_q \ v_d]^T$, $$T_s = \frac{2}{3}\begin{bmatrix} 1 & -\frac{1}{2} & -\frac{1}{2} \\ 0 & -\frac{\sqrt{3}}{2} & \frac{\sqrt{3}}{2} \end{bmatrix}, \quad T_e(\hat{\theta}) = \begin{bmatrix} \cos(\hat{\theta}) & -\sin(\hat{\theta}) \\ \sin(\hat{\theta}) & \cos(\hat{\theta}) \end{bmatrix}$$

$\hat{\theta}$ is an estimated value of the grid phase angle;

step 2: using the embedded generator as an AC voltage source, and obtaining a model of a nominal AC voltage source of a more electric aircraft according to nominal grid parameters of the more electric aircraft, with a mathematical expression satisfying formula (2):

$$\begin{bmatrix} V_a \\ V_b \\ V_c \end{bmatrix} = V_m \begin{bmatrix} \cos(\theta) \\ \cos\left(\theta - \frac{2}{3}\pi\right) \\ \cos\left(\theta + \frac{2}{3}\pi\right) \end{bmatrix} \quad (2)$$

wherein $V_a$, $V_b$ and $V_c$ are voltage of three-phase AC of the aircraft; $\theta=\omega t$ is the grid phase angle; $\omega$ is three-phase AC frequency; and $V_m$ is a three-phase voltage amplitude; converting AC $V_{abc}$ under the three-phase stationary rotating coordinate system in the formula (2) to the two-phase rotating coordinate system $v_{qd}$, and controlling $v_d=0$ to ensure that the estimated value of the grid phase angle ultimately converges to a true value of the grid phase angle;

step 3: in the case of voltage amplitude imbalance in the grid, high harmonics in the grid and DC bias, the AC in the grid of the more electric aircraft does not satisfy the situation shown in formula (2): the cases of voltage amplitude imbalance in the grid, high harmonics and DC bias respectively correspond to mathematical expressions which satisfy formula (3), formula (4) and formula (5);

$$\begin{bmatrix} V_a \\ V_b \\ V_c \end{bmatrix} = V_m \begin{bmatrix} \cos(\theta) \\ (1+\beta)\cos\left(\theta - \frac{2}{3}\pi\right) \\ (1+\gamma)\cos\left(\theta + \frac{2}{3}\pi\right) \end{bmatrix} \quad (3)$$

$$\begin{bmatrix} V_a \\ V_b \\ V_c \end{bmatrix} = \begin{bmatrix} V_m\cos(\theta) + u_5\cos(5\theta) + \ldots + u_{2n-1}\cos((2n-1)\theta) \\ V_m\cos\left(\theta - \frac{2}{3}\pi\right) + u_5\cos\left(5\left(\theta - \frac{2}{3}\pi\right)\right) + \ldots + u_{2n-1}\cos((2n-1)\left(\theta - \frac{2}{3}\pi\right)) \\ V_m\cos\left(\theta + \frac{2}{3}\pi\right) + u_5\cos\left(5\left(\theta + \frac{2}{3}\pi\right)\right) + \ldots + u_{2n-1}\cos((2n-1)\left(\theta + \frac{2}{3}\pi\right)) \end{bmatrix} \quad (4)$$

$$\begin{bmatrix} V_a \\ V_b \\ V_c \end{bmatrix} = V_m \begin{bmatrix} \cos(\theta) + V_{ao} \\ \cos\left(\theta - \frac{2}{3}\pi\right) + V_{bo} \\ \cos\left(\theta + \frac{2}{3}\pi\right) + V_{co} \end{bmatrix} \quad (5)$$

wherein $\beta$ and $\gamma$ are respectively the voltage amplitude imbalance coefficients of the aircraft three-phase grid; $v_5$ is the amplitude of 5th voltage harmonic components of the aircraft three-phase grid, and $v_{2n-1}$ is the amplitude of 2n–1th voltage harmonic components of the aircraft three-phase grid; $V_{ao}$, $V_{bo}$ and $V_{co}$ are the voltage DC biases of the aircraft three-phase grid respectively;

step 4: considering the condition of voltage amplitude imbalance of the grid, when $v_d=0$, a static error exists between the estimated value of the grid phase angle and the true value of the grid phase angle, as shown in formula (6);

$$\begin{cases} \theta - \hat{\theta} = E_{pu}\cos(2\theta + \phi_{pu}) \\ E_{pu} = \sqrt{\left(\frac{\beta-\gamma}{2\sqrt{3}}\right)^2 + \left(\frac{\beta+\gamma}{6}\right)^2} \\ \phi_{pu} = -\tan^{-1}\left(\frac{1}{\sqrt{3}}\frac{\beta+\gamma}{\beta-\gamma}\right) \end{cases} \quad (6)$$

wherein $\hat{\theta}$ is the estimated value of the grid phase angle of the aircraft;

step 5: considering the situation of high harmonics in the grid, when $v_d=0$, obtaining a static error between the estimated value of the grid phase angle and the true value of the grid phase angle, as shown in formula (7);

$$\begin{cases} \theta - \hat{\theta} = E_{6h}\sin 6\theta + E_{12h}\sin 6\theta + \ldots + E_{6nh}\sin 6n\theta \\ E_{6h} = \frac{u_5 - u_7}{V_m} \\ E_{12h} = \frac{u_{11} - u_{13}}{V_m} \\ E_{6nh} = \frac{u_{6n-1} - u_{6n+1}}{V_m} \end{cases} \quad (7)$$

wherein $v_5$ is the amplitude of 5th voltage harmonics, $v_7$ is the amplitude of 7th voltage harmonics, is the amplitude of 11th voltage harmonics, $v_{13}$ is the amplitude of 13th voltage harmonics, $v_{6n-1}$ is the amplitude of 6n–1th voltage harmonics, $V_{6n+1}$ is the amplitude of 6n+1 voltage harmonics, $E_{6h}$ is the voltage amplitude synthesized by the amplitudes of 5th and 7th harmonic components, $E_{12h}$ is the voltage amplitude synthesized by the amplitudes of 11th and 13th harmonic components, $E_{6h}$, is the voltage amplitude synthesized by the amplitudes of 6n–1 and 6n+1 harmonic components, and n is a positive integer;

step 6: considering the situation of DC bias in the grid, when $v_d=0$, obtaining a static error between the estimated value of the grid phase angle and the true value of the grid phase angle, as shown in formula (8);

$$\begin{cases} \theta - \hat{\theta} = E_{do}\cos(\theta + \phi_{do}) \\ E_{do} = \sqrt{\frac{4}{9}(V_{ao} + V_{bo} + V_{co})^2 + \frac{1}{3}(-V_{bo} + V_{co})^2} \\ \phi_{do} = -\tan^{-1}\left(\frac{2}{3\sqrt{3}}\frac{V_{ao} + V_{bo} + V_{co}}{-V_{bo} + V_{co}}\right) \end{cases} \quad (8)$$

wherein $V_{ao}$, $V_{bo}$ and $V_{co}$ are the voltage DC biases of the aircraft three-phase grid respectively, $E_{do}$ is an amplitude gain coefficient caused by the DC bias of the grid, and $\phi_{do}$ is an initial phase angle caused by the DC bias of the grid;

step 7: step 4, step 5 and step 6 indicate that the grid has static errors in the estimation of the grid phase angle caused by voltage amplitude imbalance, high harmonics and DC bias; in order to eliminate the static errors, integrating the information of voltage amplitude imbalance, high harmonics and DC bias in the grid into the grid synchronization module; according to the principle of linear superposition, superimposing the information of step 4, step 5 and step 6 into formula (9) to obtain a nominal mathematical model required by the aircraft grid phase angle tracker based on nonlinear active disturbance rejection, as shown in formula (9);

$$\begin{cases} \dot{x}_1 = b_0 u + x_2, \\ \dot{x}_2 = -q \end{cases} \quad (9)$$

wherein $$x_1 = \frac{v_d}{V_m}, \; x_2 = (b - b_0)(\hat{\omega} - \omega) + \frac{d_{total}}{V_m}, \; u = \hat{\omega} - \omega.$$

$$d_{total} = \dot{d}_{PU} + \dot{d}_{YO} + \dot{d}_{YH} + \dot{d}_{LIN}$$

$$d_{PU} = V_m\left[\frac{\beta-\gamma}{2\sqrt{3}}\cos(2\theta) - \frac{\beta+\gamma}{6}\sin(2\theta)\right],$$

-continued $$d_{VO} = E_{do}\cos(\theta + \phi_{do}),$$

$$d_{VH} = V_m E_{6h}\sin 6\theta + V_m E_{12h}\sin 6\theta + \ldots + V_m E_{6nh}\sin 6n\theta,$$

$$d_{LIN} = -\left(\frac{\beta+\gamma}{3}+1\right)V_m\sin(\theta-\hat{\theta}) + \left(\frac{\beta+\gamma}{3}+1\right)V_m(\theta-\hat{\theta}) \quad (5)$$

wherein b is the gain coefficient of control input, u is the control input, $b_0$ is the estimated value of the gain coefficient of the control input, $\omega$ is grid frequency, $\hat{\omega}$ is the estimated value of the grid frequency, $d_{total}$ is total disturbance, $d_{PU}$ is disturbance caused by voltage imbalance, $d_{VO}$ is disturbance caused by voltage DC bias, $d_{VH}$ is disturbance caused by voltage high harmonics, and $d_{LIN}$ is disturbance caused by linearization;

step 8: designing the aircraft grid phase angle tracker based on nonlinear active disturbance rejection based on formula (9), which is composed of formula (10) and formula (11); formula (10) is a linear state error feedback law, and formula (11) is a generalized integral nonlinear extended state observer; u calculated in formula (10) is a difference value between the estimated grid frequency and the real grid frequency; the real grid frequency $\omega$ is equal to the sum of u and the speed of the aviation gas turbine engine; since the speed of the aviation gas turbine engine can be measured by sensors, the information is known; special attention is paid to that the unit of the speed of the aviation gas turbine engine here should exist in the form of rad/s; and finally, integral calculation is conducted on $\omega$ to obtain the phase angle of the aircraft grid;

$$\begin{cases} e_2 = v_d^* - v_d \\ u = \dfrac{u_0 + k_p \int \sum_{i=1}^{3} z_{2(\omega_{ri})} dt - z_{2(0)}}{b_0} \\ u_0 = k_p \cdot e_2 \end{cases} \quad (10)$$

$$\begin{cases} e_1 = z_1 - x_1 \\ z_1^\& = z_2 - L_1 \cdot e_1 + b_0 u \\ z_2^\& = -L_2 \cdot fal(e_1, \alpha_1) + g_1 + g_2 + g_3 \\ d_1^\& = g_1 \\ d_2^\& = g_2 \\ d_3^\& = g_3 \\ g_1^\& = -\omega_{r1}^2 d_1 + u_1^\& K_{r1} \\ g_2^\& = -\omega_{r2}^2 d_2 + u_1^\& K_{r2} \\ g_3^\& = -\omega_{r3}^2 d_3 + u_1^\& K_{r3} \\ u_1 = -L_2 \cdot fal(e_1, \alpha_2) \end{cases} \quad (11)$$

wherein $fal(e_1, \alpha_i) = |e_1|^{\alpha_i} \text{sign}(e_1)$, $i \in \{1, 2, 3, 4, 5\}$;

wherein $v_d^*$ is the reference value of $v_d$, $k_p$ is a proportionality coefficient, $Z_1$ is the estimated value of $x_1$, $z_2$ is the estimated value of $x_2$, and $L_1$ and $L_2$ are the gain coefficients of the generalized integral nonlinear extended state observer; $z_{2(\omega_{r1})} = \int g_1 dt$; $z_{2(\omega_{r2})} = \int g_2 dt$, $z_{2(\omega_{r3})} = \int g_3 dt$ and $z_{2(0)}$ are unmodeled dynamic estimated values; $z_{2(\omega_{r1})} = d_1$; $z_{2(\omega_{r2})} = d_2$; $z_{2(\omega_{r3})} = d_3$; $d_1^\&$ is the derivative of the time of $d_1$; $d_2^\&$ is the derivative of the time of $d_2$; $d_3^\&$ is the derivative of the time of $d_3$; $\omega_{r1} = 0$ is frequency compensation in the case of DC bias in grid voltage; $K_{r1}$ is the gain coefficient of the frequency compensation; $\omega_{r2} = 2\omega$ is frequency compensation in the case of grid voltage imbalance; $K_{r2}$ is the gain coefficient of the frequency compensation; $\omega_{r3} = 6\omega$ is frequency compensation in the case of the high harmonics in the grid voltage; $K_{r3}$ is the gain coefficient of the frequency compensation; $u_1^\&$ is the derivative of time of $u_1$; and $\alpha_1$ and $\alpha_2$ are real numbers between 0 and 1.

* * * * *